US008921964B1

(12) United States Patent
Pavani

(10) Patent No.: US 8,921,964 B1
(45) Date of Patent: Dec. 30, 2014

(54) DUAL LAYER PIXEL LENS FOR LOW LIGHT CAMERAS

(71) Applicant: Arecont Vision, LLC., Glendale, CA (US)

(72) Inventor: Sri Rama Prasanna Pavani, Los Angeles, CA (US)

(73) Assignee: Arecont Vision, LLC., Glendale, CA (US)

(*) Notice: Subject to any disclaimer, the term of this patent is extended or adjusted under 35 U.S.C. 154(b) by 0 days.

(21) Appl. No.: 13/973,926

(22) Filed: Aug. 22, 2013

(51) Int. Cl.
*H01L 31/0232* (2014.01)
*H01L 27/146* (2006.01)
*H01L 31/0236* (2006.01)
*H01L 27/144* (2006.01)

(52) U.S. Cl.
CPC .... *H01L 27/14627* (2013.01); *H01L 31/02366* (2013.01); *H01L 27/1446* (2013.01)
USPC .......................................... 257/432; 257/436

(58) Field of Classification Search
CPC ................................................ H01L 31/02366
See application file for complete search history.

(56) References Cited

U.S. PATENT DOCUMENTS

| 4,694,185 | A | 9/1987 | Weiss |
| 5,323,052 | A | 6/1994 | Koyama |
| 5,593,913 | A | 1/1997 | Aoki |
| 2005/0242271 | A1* | 11/2005 | Weng et al. ................. 250/214.1 |
| 2006/0049439 | A1* | 3/2006 | Oh et al. ........................ 257/292 |
| 2007/0018213 | A1* | 1/2007 | Lim .............................. 257/292 |

* cited by examiner

*Primary Examiner* — Stephen W Smoot
(74) *Attorney, Agent, or Firm* — Christie, Parker & Hale, LLP

(57) ABSTRACT

An image sensor for low light cameras including a plurality of image pixels, each including: a photodiode layer; an oxide layer; a metal layer; a first microlens layer for focusing an incident light onto the photodiode layer; and a second microlens layer formed on top of the first microlens layer for generating a collimated light from a sharp-angled light from a low light camera and illuminating said collimated light to the first microlens layer to be focused on the photodiode layer.

19 Claims, 9 Drawing Sheets

DUAL LAYER PIXEL LENS FOR LOW LIGHT CAMERAS

FIELD OF THE INVENTION

The present invention relates to image sensors and more particularly to a dual layer pixel lens for image sensors.

BACKGROUND

Solid state (semiconductor) image sensors are increasingly being used in consumer electronic devices such as mobile phones and various digital cameras. Image sensors convert optical radiation into electronic signals and are currently mostly implemented by digital charge-coupled device (CCD) devices or complementary metal-oxide-semiconductor (CMOS) devices. FIGS. 1A and 1B show a conventional front side illuminated (FSI) pixel. As shown in FIG. 1A, a metal layer 11 enables the transfer of electrical signal from the photodiode 10, and a nitride layer 12 acts as a passivation. An oxide layer 13 supports the metal layer and acts as a transparent homogenous medium between the photodiode and the nitride later. Additionally, a microlens layer 15 is placed on top of a filter layer 14 to focus the collimated light falling on the pixel 1, onto the photodiode 10. For achieving high quantum efficiency (QE), the focal length of the microlens layer 15 is designed such that the focal point falls on the photodiode. This produces a high QE for the on-axis collimated light 16, for example, a collimated light with 0° chief ray angle (CRA).

For lenses with high CRA angles at off-axis regions 17, the microlens and filter combination 18 are shifted for the pixels around the edges of the image sensor, as shown in FIG. 1B. This microlens (& filter) shifting also achieves a high QE for the off-axis collimated light with high CRA. For lenses with low CRA angles in off-axis regions, the filter and microlens combination 18 may not be shifted.

FIG. 1C shows an image sensor 10 that comprises of many rows and columns of the image pixel 1. As described above, the pixels around the edges of the image sensor 10, may have their microlens and filter combination shifted to compensate for the shift of the collimated light due to the position of those pixels When the image sensor is placed and integrated in a camera, the light rays falling on the pixels of the image sensor are not collimated anymore, because of focusing from the camera lens, as shown in FIGS. 2A and 2B. Since the microlenses of the pixels are designed for collimated light, they do not focus the non-collimated incoming light rays at the photodiode. This leads to light loss and QE degradation, which becomes more significant in lowlight situations.

Typically, in a low light situation, digital cameras use a "fast lens" with low f-number to improve low-light sensitivity of the camera. That is, a camera lens with a larger maximum aperture (a smaller minimum f-number) is called a fast lens, because it delivers more light intensity to the focal plane and therefore achieves the same light collection with a faster shutter speed. However, additional light collected by fast lenses have steep angles which are attenuated by the pixels since they are not directly focused on the photodiode layer of the pixel. This leads to a minimum low light sensitivity improvement when fast lenses are used with FSI pixels. As a result there is a need for improved pixel QE for low light cameras.

SUMMARY

In some embodiments, the present invention is an improved pixel for low light cameras that includes dual layer optics. That is, the image sensor according to the present invention includes two microlenses for each pixel.

In some embodiments, the present invention is an image sensor for low light cameras. The image sensor includes a plurality of image pixels. Each image pixel comprising: a photodiode layer; an oxide layer; a metal layer; a first microlens layer for focusing an incident light onto the photodiode layer; and a second microlens layer formed on top of the first microlens layer for generating a collimated light from a sharp-angled light from a low light camera and illuminating said collimated light to the first microlens layer to be focused on the photodiode layer.

In some embodiments, the present invention is an image pixel comprising: a photodiode layer; an oxide layer; a metal layer; a first microlens layer for focusing an incident light onto the photodiode layer; and a second microlens layer formed on top of the first microlens layer for generating a collimated light from a sharp-angled light from a low light camera and illuminating said collimated light to the first microlens layer to be focused on the photodiode layer.

The second microlens layer may be a convex lens layer, a concave lens layer, or a combination thereof. In some embodiments, the second microlens layer may be formed on the first microlens layer by optical lithography and thermal reflow process.

DETAIL DESCRIPTION

In some embodiments, the present invention is a dual layer pixel lens for image sensors that produces a high QE for a low light camera, which may include a fast lens.

Figure 1A:
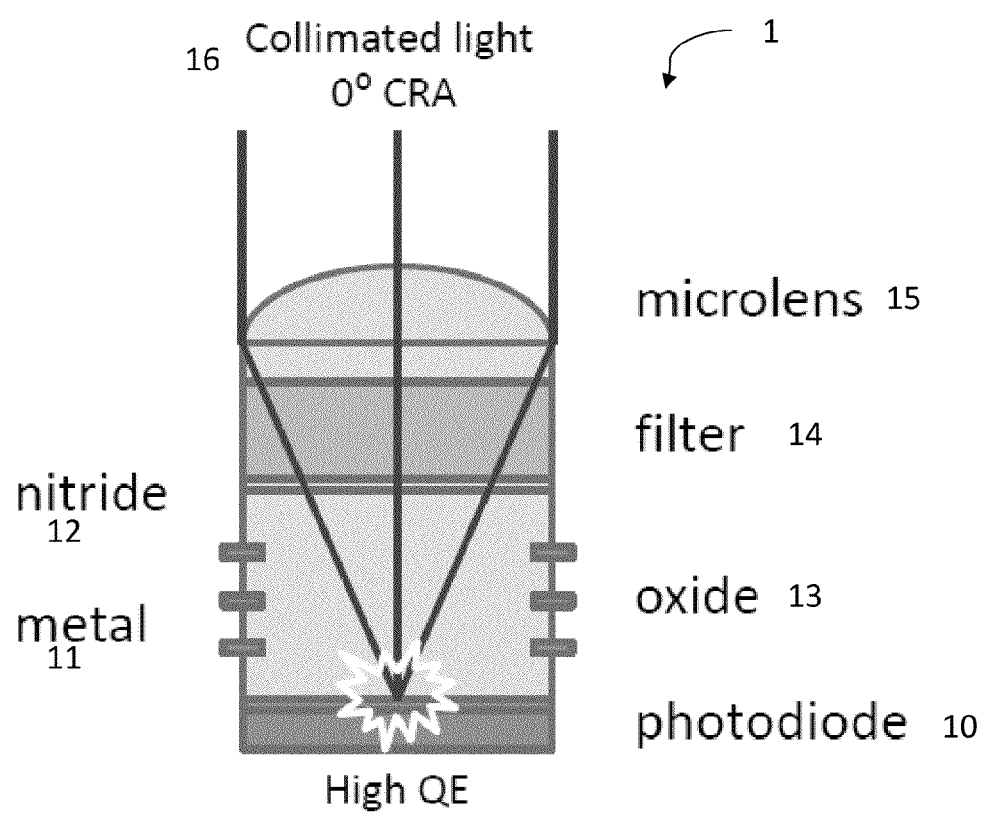
FIGS. 1A and 1B show a conventional front side illuminated (FSI) pixel.
Figure 1B:
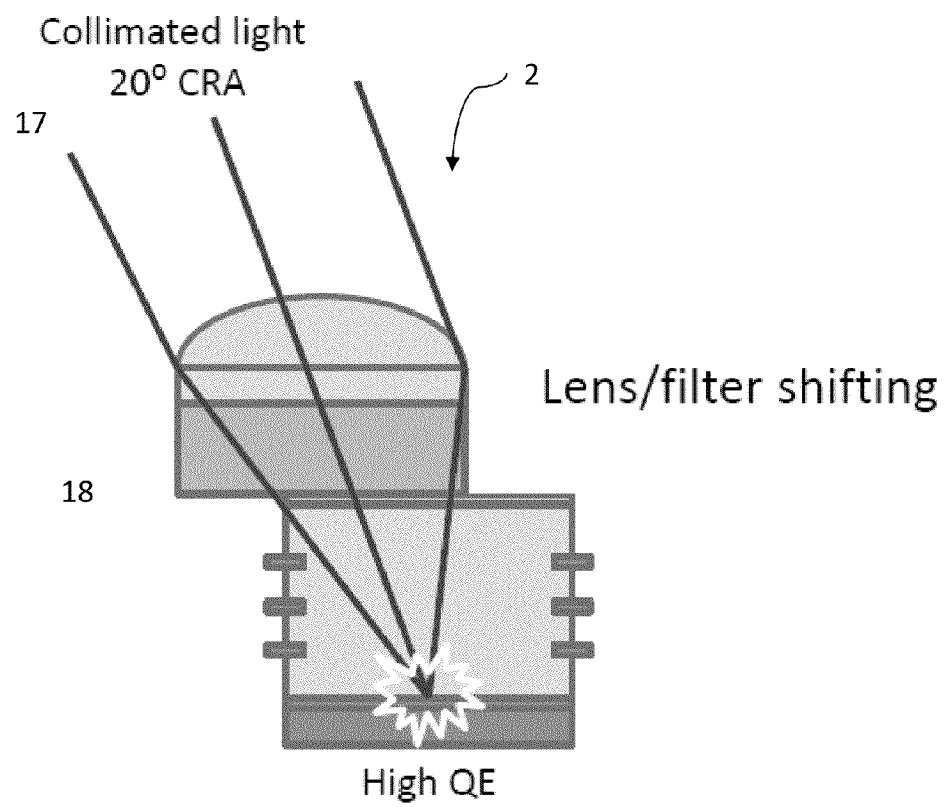
Figure 1C:
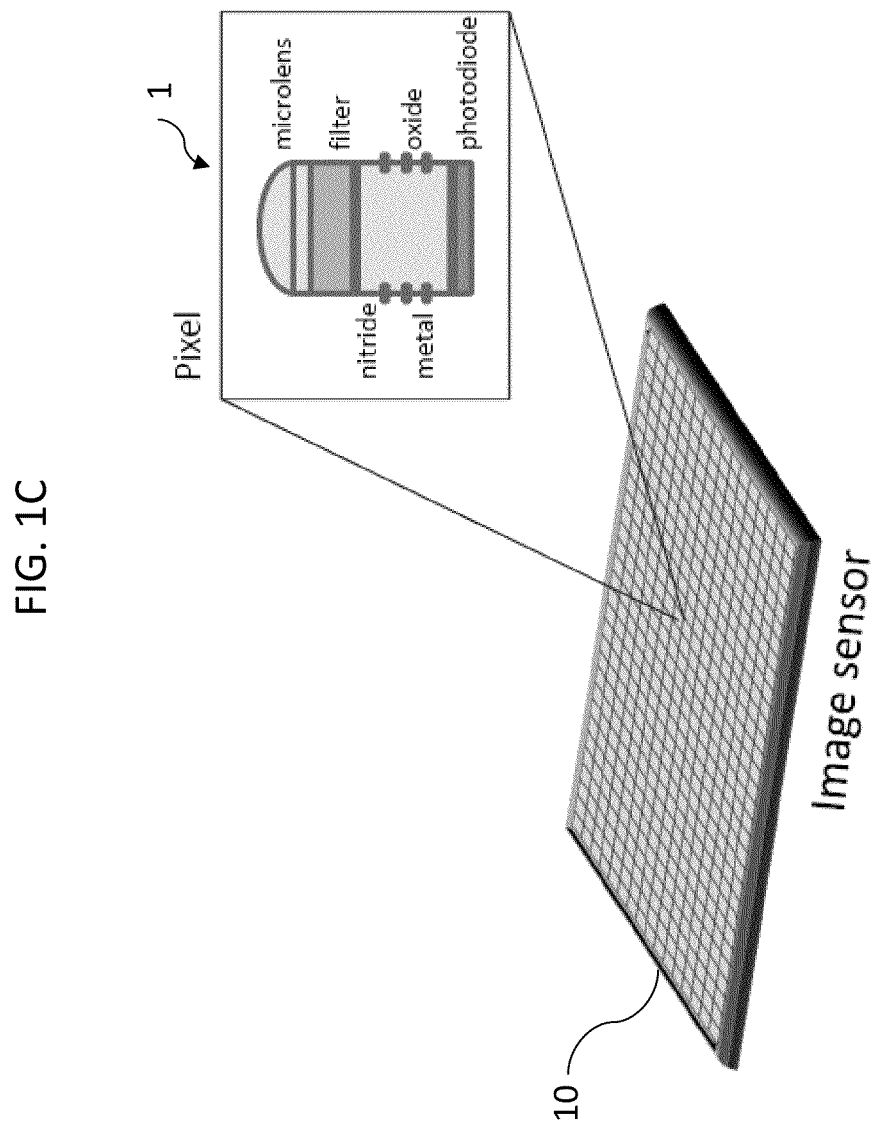
FIG. 1C shows an image sensor comprising of several rows and columns of an image pixel.
Figure 2A:
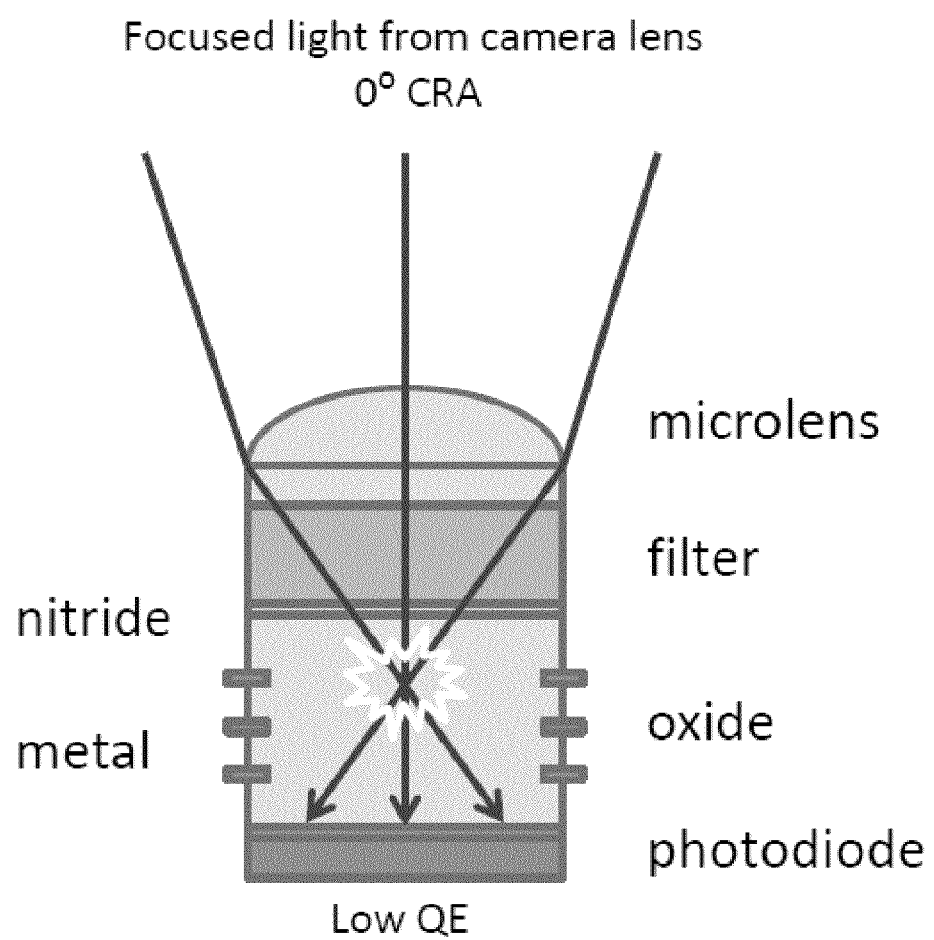
FIGS. 2A and 2B show a conventional front side illuminated (FSI) pixel being used in a camera with a lens.
Figure 2B:
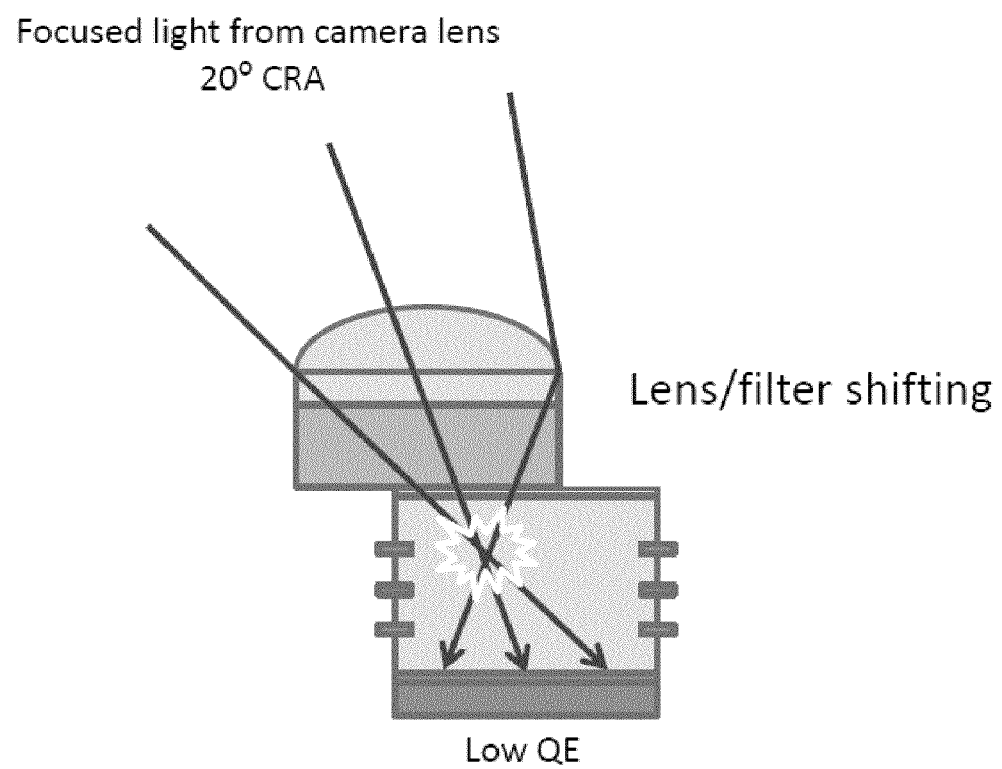
Figure 3A:
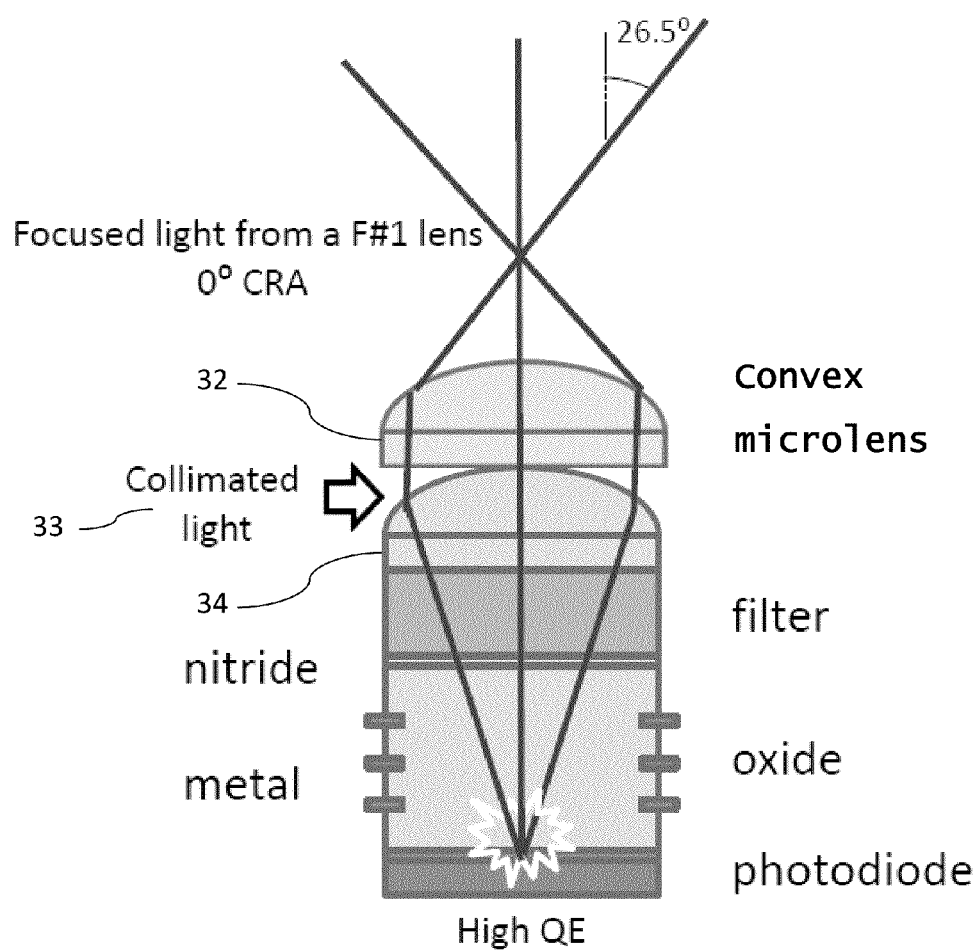
FIGS. 3A and 3B illustrate a dual layer pixel-optics, according to some embodiments of the present invention.
Figure 3B:
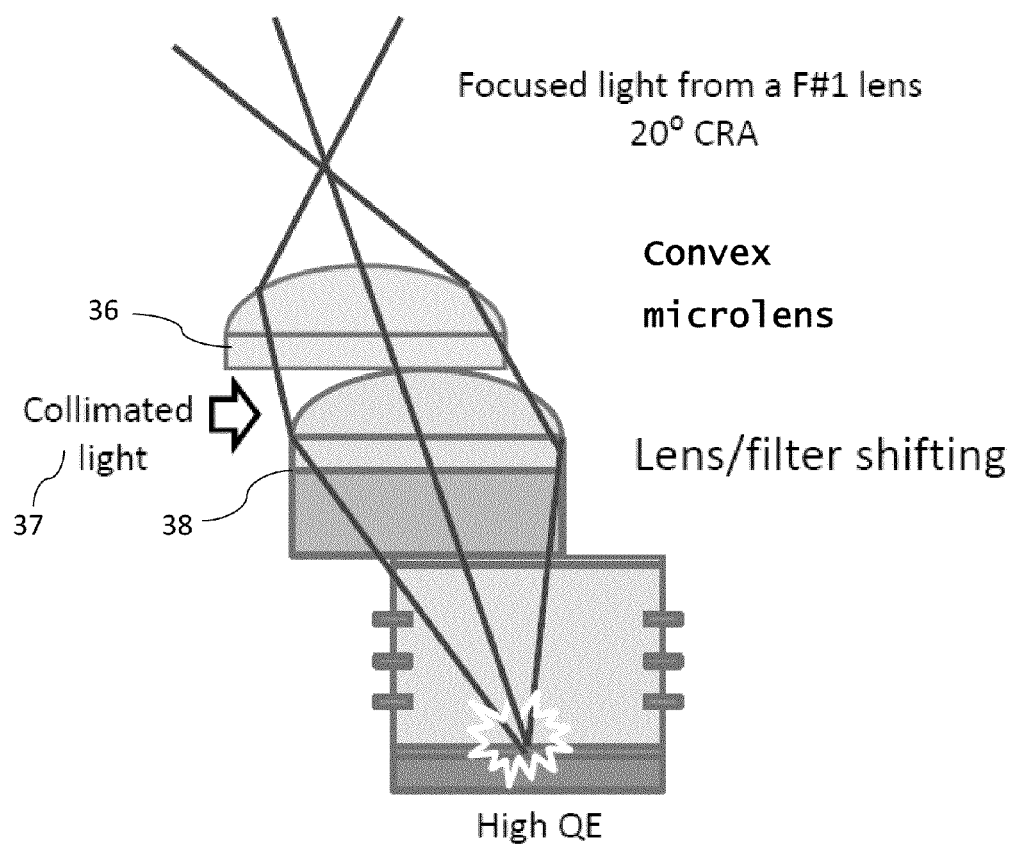

FIGS. 3A and 3B illustrate a dual layer pixel-optics, according to some embodiments of the present invention. As shown in FIG. 3A, a second (convex) microlens 32 is placed (manufactured) directly over a first microlens 34 to generate a collimated light 33 from the sharp-angled light from the fast camera lens before the first microlens 34. That is, the second microlens 32 collimates all light so that the first microlens 34 can focus light on the photodiode. This way, a high QE is achieved since the focal point of light falls on the photodiode and not on the metal or oxide layers. The second microlens 32 is designed such that most or all rays from the main camera lens are collimated. In some embodiments, the f-number of the second microlens may be identical to the f-number of the main camera lens. In some embodiments, the f-number of the second microlens may be higher or slightly lower than the f-number of the main camera lens. The shape and the refractive index of the second microlens is designed appropriately to achieve the above phenomenon. In some embodiments, the oxide layer may include a light guide. The light guide may serve to channel light in the oxide layer so as to avoid crosstalk and losses in the metal layers.

Similarly, FIG. 3B depicts a second (convex) microlens 36 that is placed (manufactured) directly over the first microlens 38 that is shifted over the photodiode for the off-axis (corner) pixel. This configuration, similar to that of FIG. 3A, also generates a collimated light 37 from the sharp-angled light from the fast camera lens before the first microlens 38 to also obtain a high QE. Although, the second microlenses 32 and 36 are shown as convex lenses, other type of microlenses are also within the scope of the present invention, as described below.

Figure 4A:
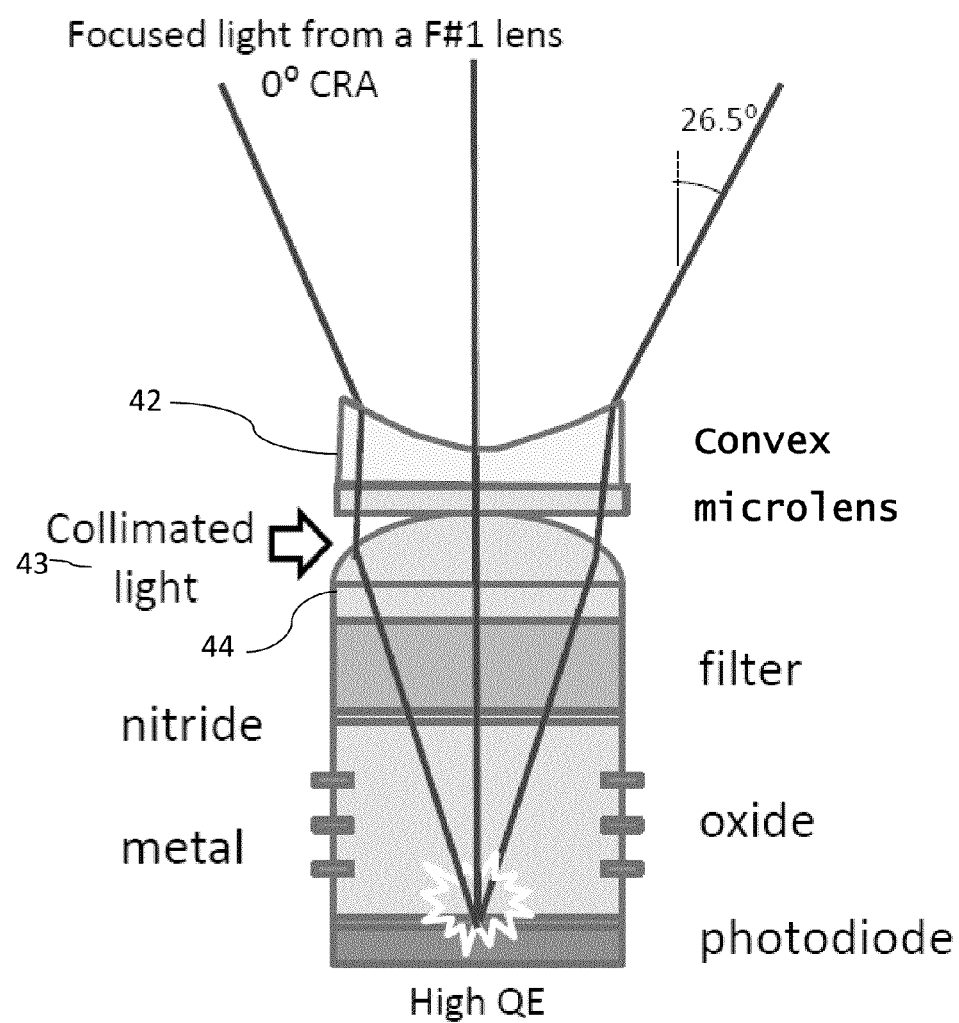
FIGS. 4A and 4B illustrate a dual layer pixel-optics, according to some embodiments of the present invention.
Figure 4B:
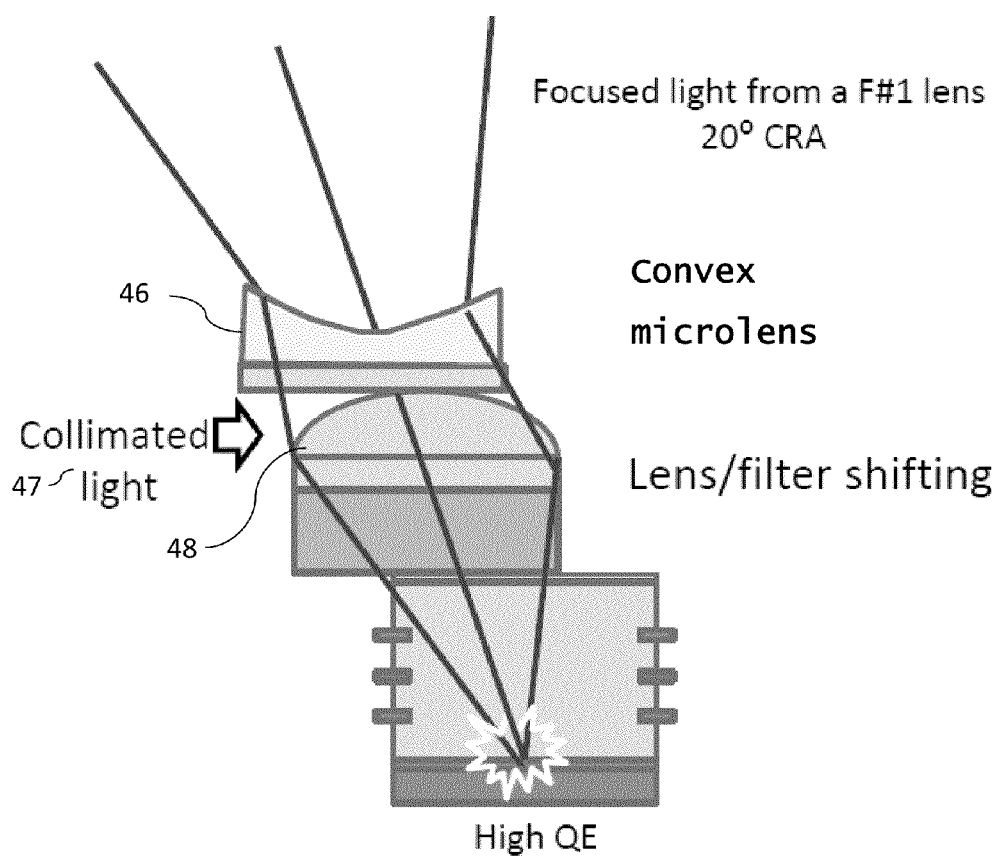
Figure 1A:
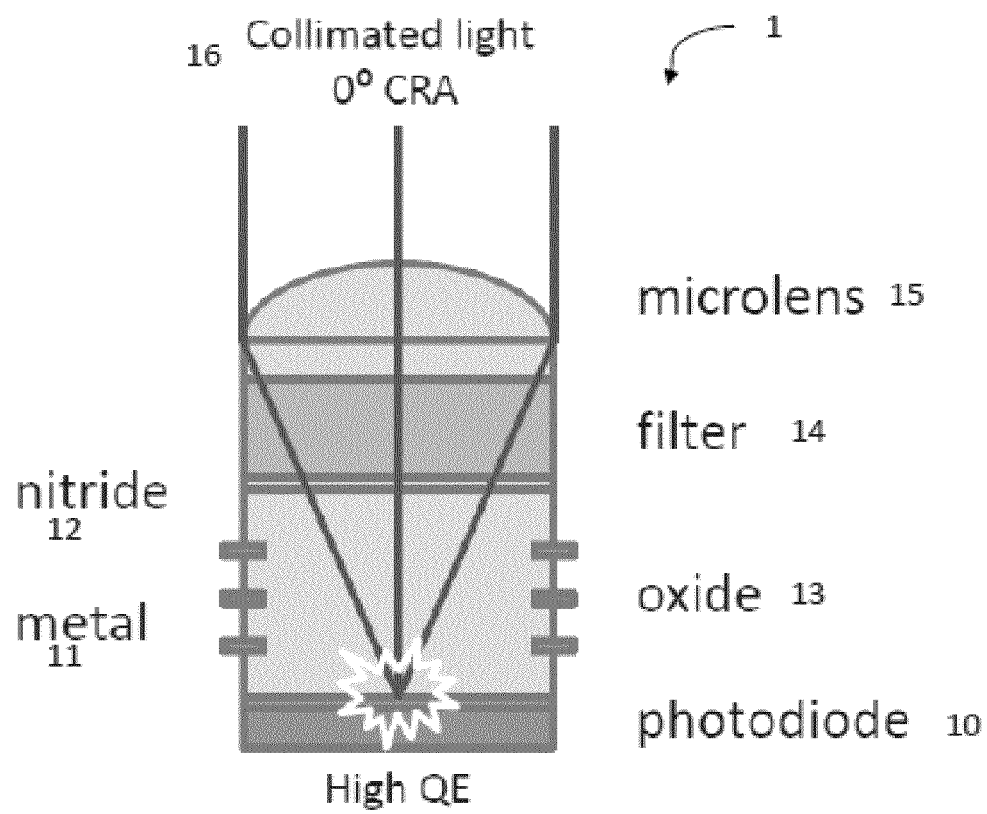
Figure 1B:
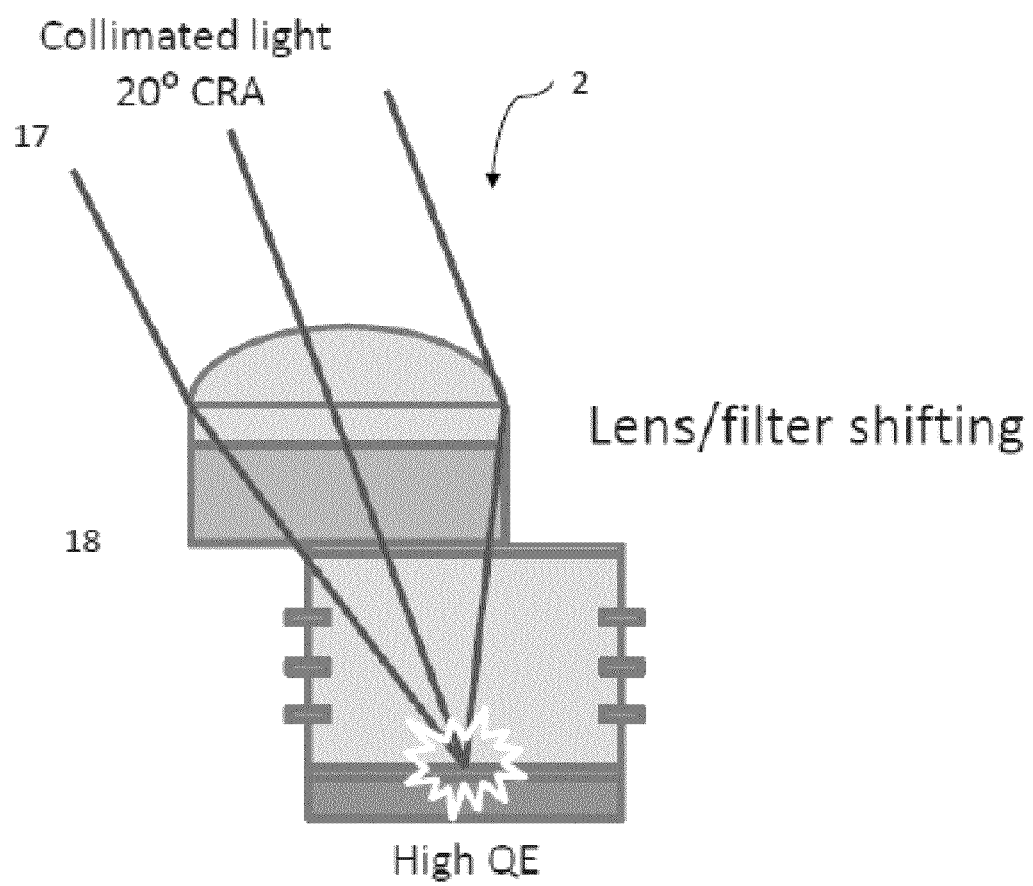
Figure 1C:
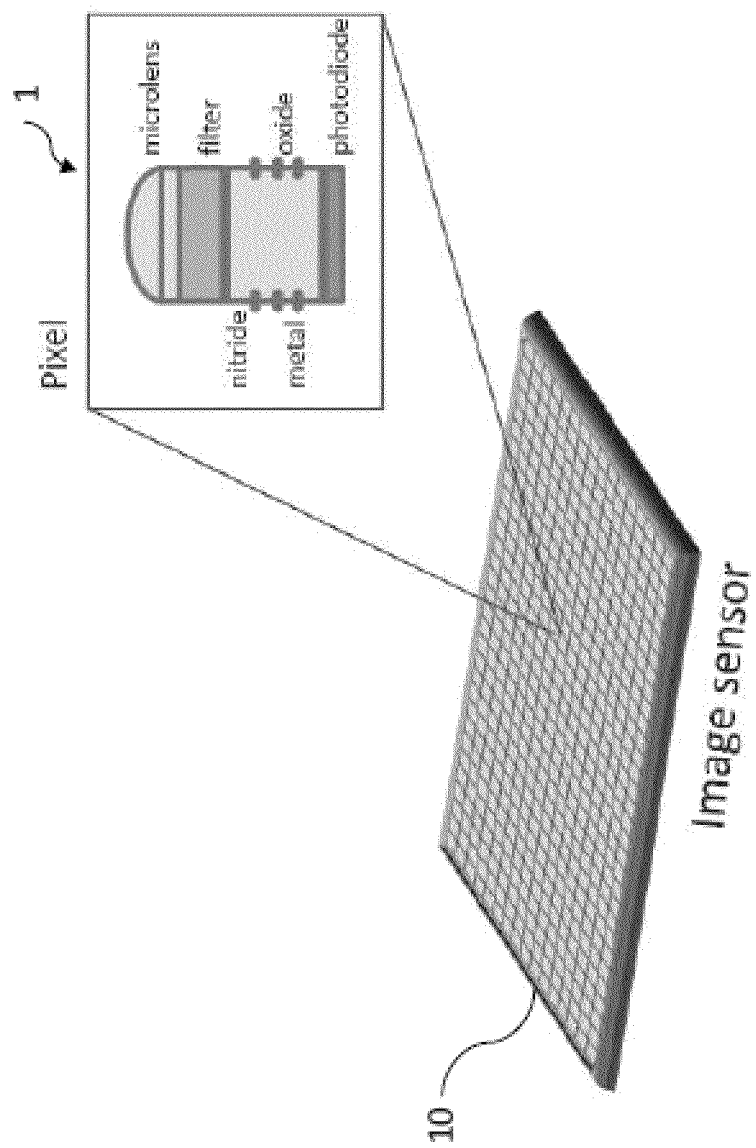
Figure 2A:
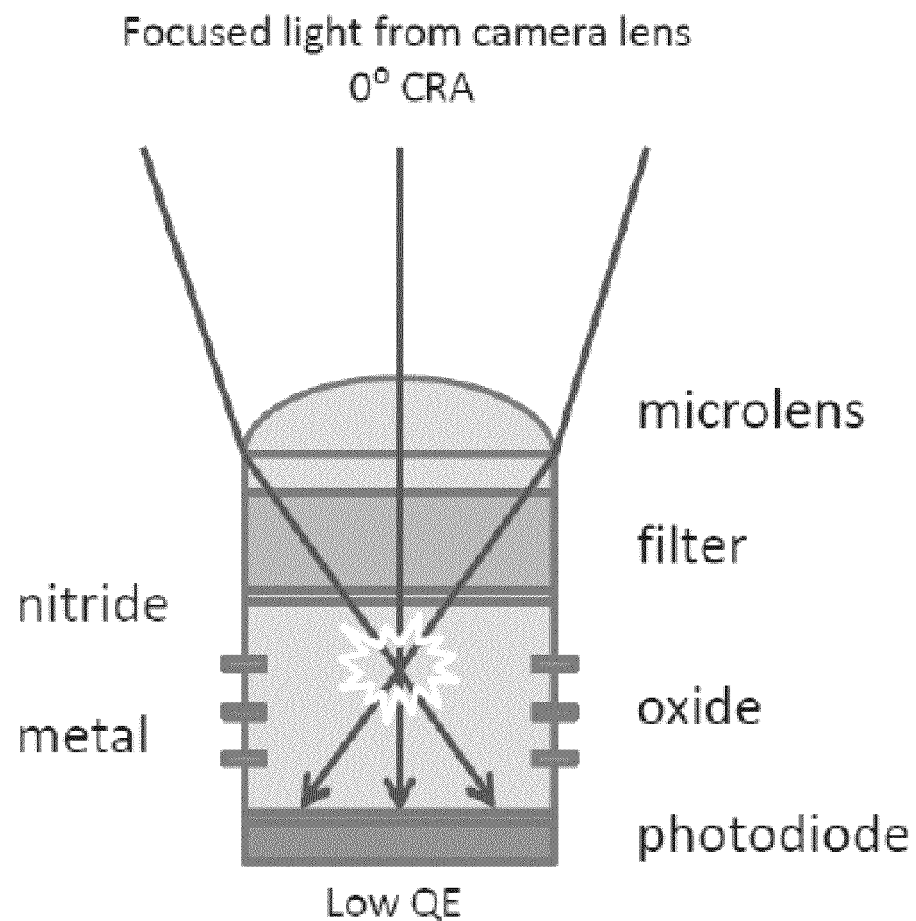
Figure 2B:
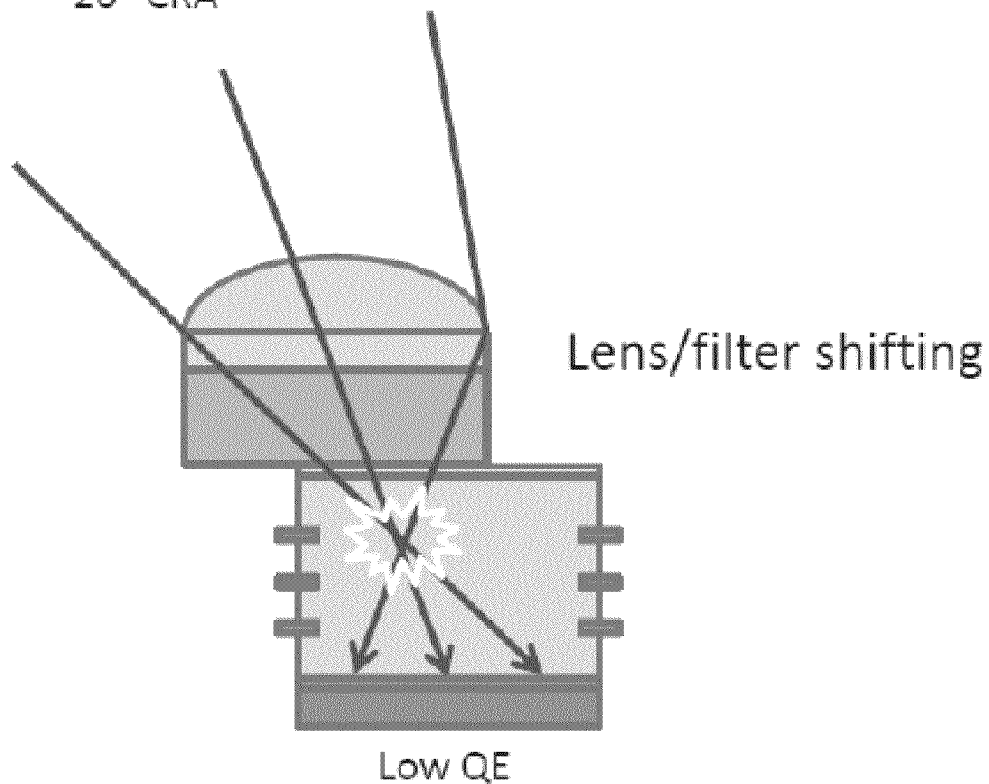
Figure 3A:
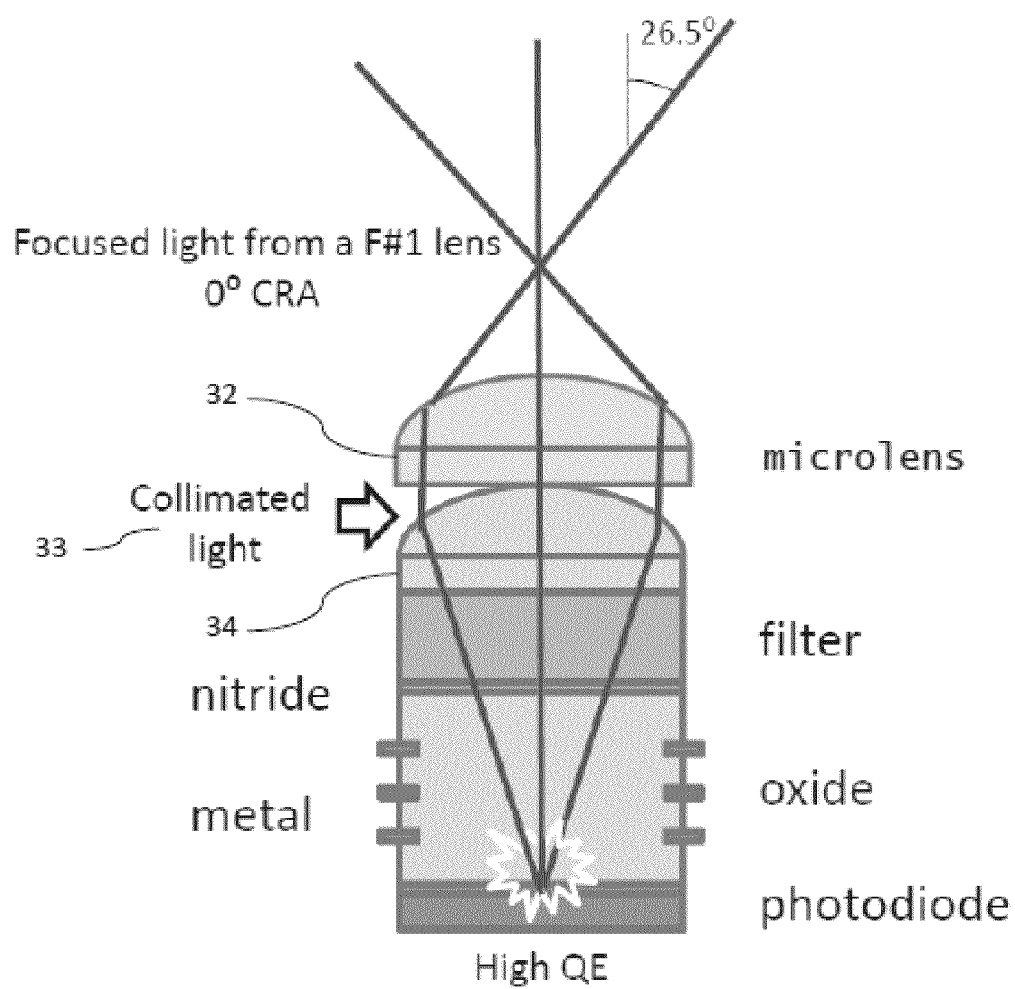
Figure 3B:
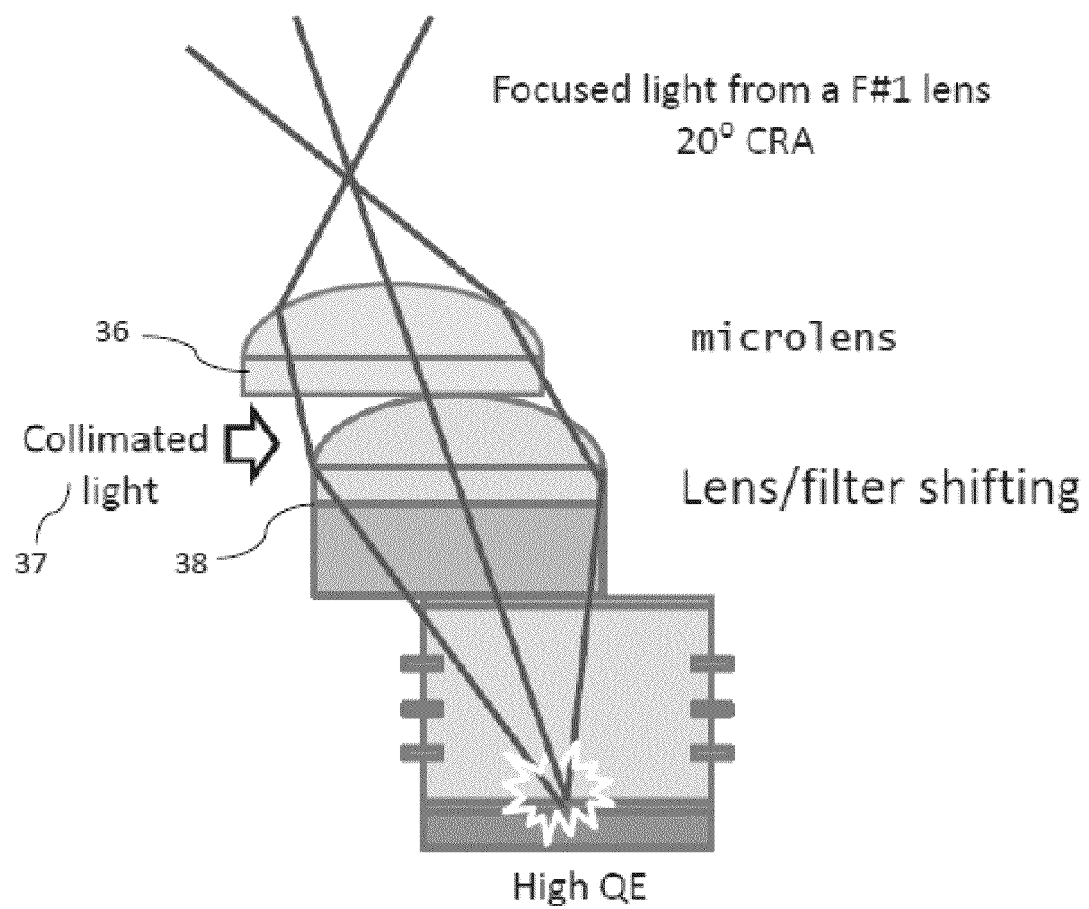
Figure 4A:
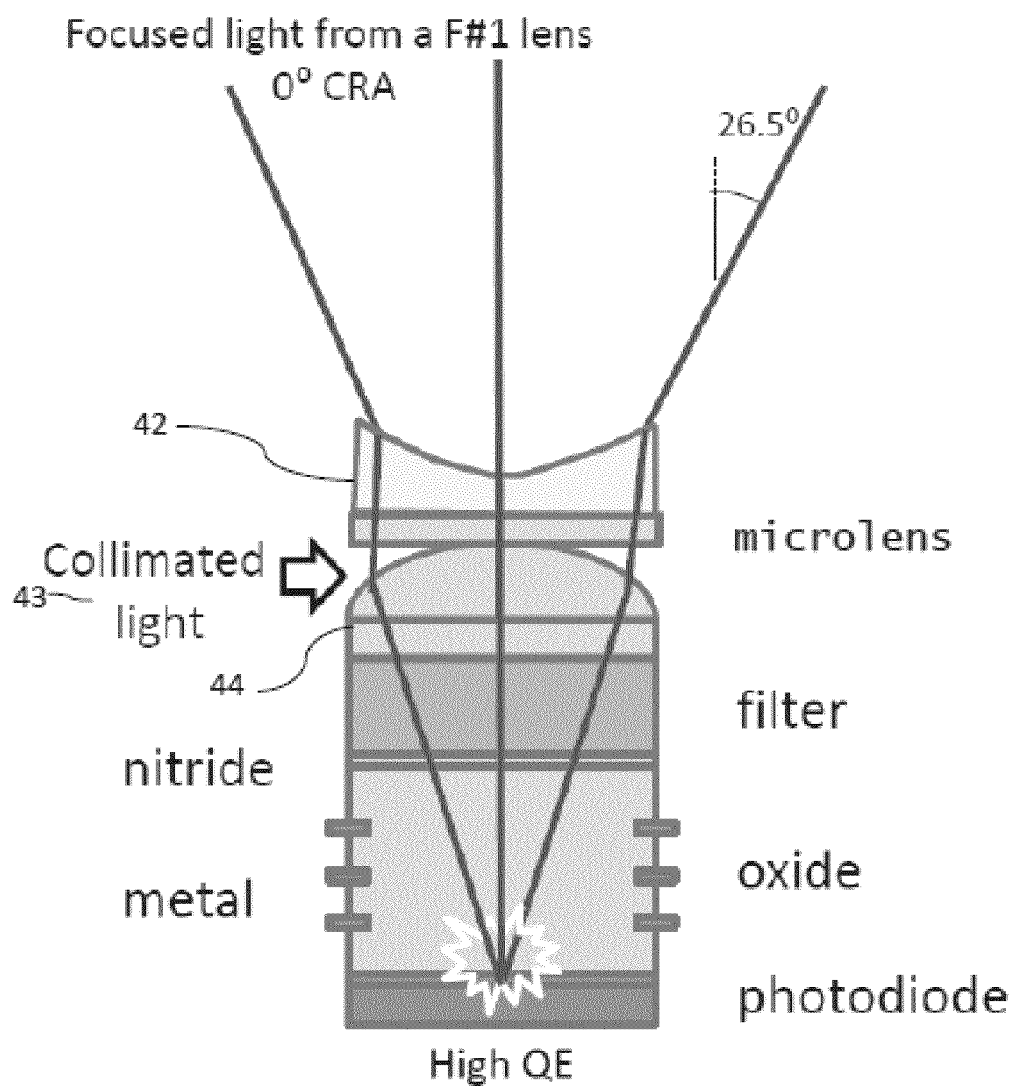
Figure 4B:
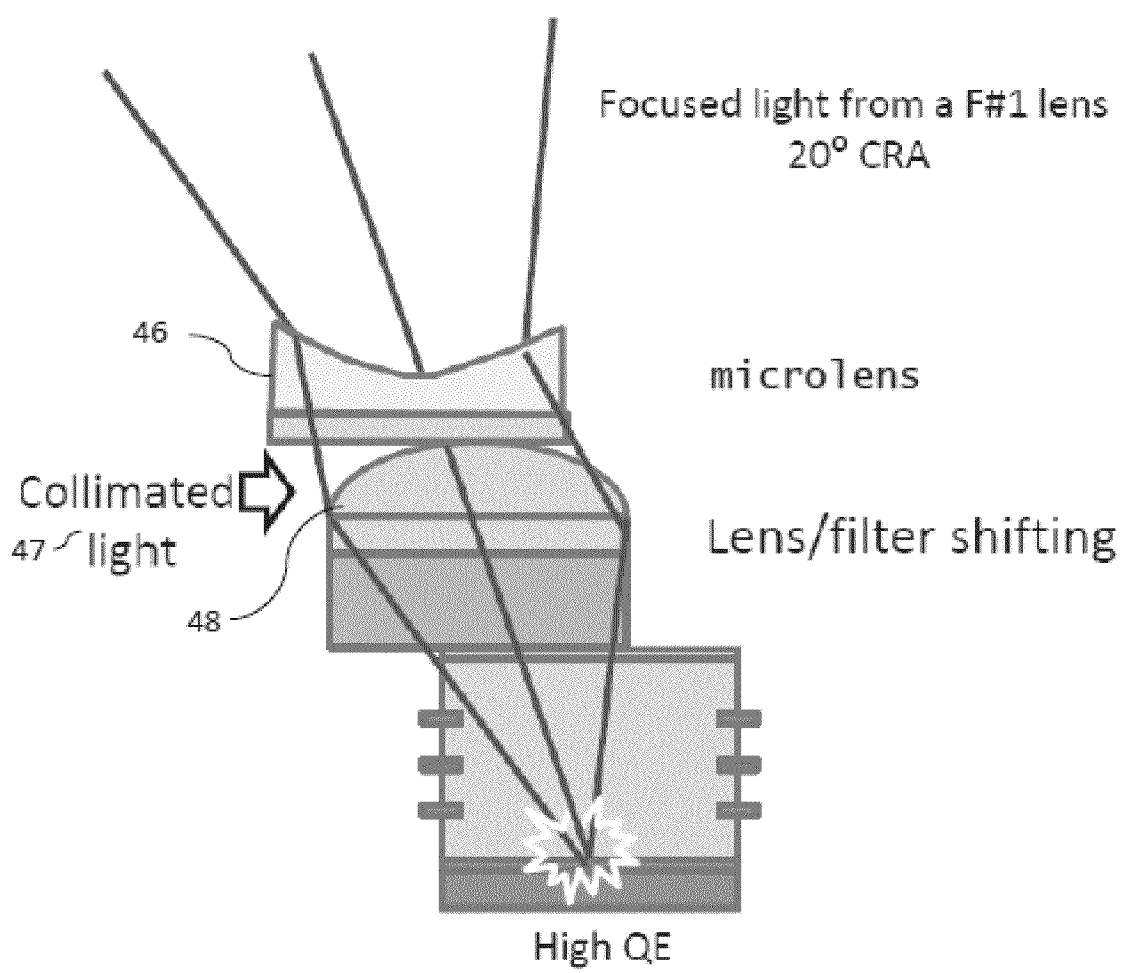

FIGS. 4A and 4B illustrate a dual layer pixel-optics, according to some embodiments of the present invention. As shown in FIG. 4A, a second (concave) microlens 42 is directly placed over a first microlens 44 to create a collimated light 43 from the sharp-angled light from the fast camera lens before the first microlens 44. That is, the second concave microlens 42 collimates all light so that the first microlens 44 can focus light on the photodiode. Consequently, a high QE is obtained since the focal point of light falls on the photodiode and not on the metal or oxide layers. It is noted that the angles shown in FIGS. 3A and 4A are for illustration purpose only and one skilled in the art would recognize that the present invention is not limited to those illustrative angles.

Likewise, FIG. 4B shows a second (concave) microlens 46 that is placed over the first microlens 48 that is shifted over the photodiode for the off-axis (corner) pixel. This configuration, similar to that of FIG. 4A, also produces a collimated light 47 from the sharp-angled light from the fast camera lens before the first microlens 48 to also obtain a high QE. In some embodiments, the image pixels are fabricated with a front side illumination process. In some embodiments, the image pixels are fabricated with a back side illumination process.

A combination of concave and convex microlenses could also be used to collimate light before it falls on the first microlens. The second microlens may be manufactured as a layer comprising of multiple laterally displaced microlenses using a combination of lithography and thermal reflow. In some embodiments, a photoresist or a similar layer is spin-coated on a planar substrate and is patterned into cuboid or rectangular blocks using optical lithography. The photoresist patterns are heated in a thermal reflow process to form microlenses. In some embodiments, microlenses may be formed by dropping optical epoxy on a planar substrate and exposing the epoxy to ultra-violet or other electromagnetic radiation. In yet another embodiment, the dual microlens layer may be fabricated with a molding process using a moldable polymer and a master mold, which may be fabricated using lithography or diamond turning.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

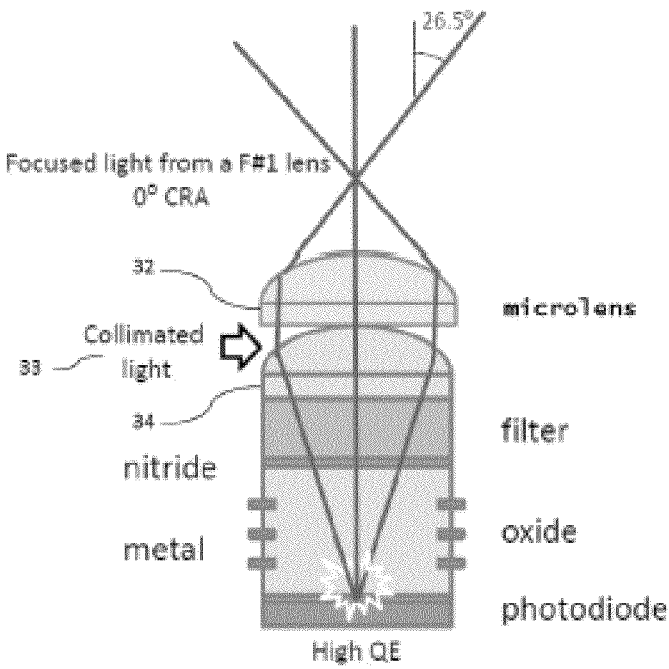

What is claimed is:

1. An image sensor for low light cameras comprising:
   a plurality of image pixels, each image pixel comprising:
   a photodiode layer;
   an oxide layer;
   a metal layer;
   a first microlens layer for focusing an incident light onto the photodiode layer; and
   a second microlens layer formed directly on top of the first microlens layer for generating a collimated light from a sharp-angled light from a low light camera and illuminating said collimated light to the first microlens layer to be focused on the photodiode layer.

2. The image sensor of claim 1, wherein the second microlens layer is a convex lens layer.

3. The image sensor of claim 1, wherein the second microlens layer is a concave lens layer.

4. The image sensor of claim 1, wherein the second microlens layer is a combination of a convex lens layer and a concave lens layer.

5. The image sensor of claim 1, wherein the second microlens layer is formed on the first microlens layer by optical lithography and thermal reflow process.

6. The image sensor of claim 1, further comprising a filter layer formed under the first microlens layer.

7. The image sensor of claim 1, wherein the plurality of image pixels are fabricated with a front side illumination process.

8. The image sensor of claim 1, wherein the plurality of image pixels are fabricated with a back side illumination process.

9. The image sensor of claim 1, wherein the oxide layer includes a light guide.

10. The image pixel of claim 9, wherein the plurality of image pixels are fabricated with a front side illumination process.

11. The image pixel of claim 9, wherein the plurality of image pixels are fabricated with a back side illumination process.

12. The image sensor of claim 1, wherein the second microlens layer is formed over the first microlens layer in a shifted position on a lateral axis with respect to the photodiode layer.

13. An image pixel comprising:
   a photodiode layer;
   an oxide layer;
   a metal layer;
   a first microlens layer for focusing an incident light onto the photodiode layer; and
   a second microlens layer formed directly on top of the first microlens layer for generating a collimated light from a sharp-angled light from a low light camera and illuminating said collimated light to the first microlens layer to be focused on the photodiode layer.

14. The image pixel of claim 13, wherein the second microlens layer is a convex lens layer.

15. The image pixel of claim 13, wherein the second microlens layer is a concave lens layer.

16. The image sensor of claim 13, wherein the second microlens layer is a combination of a convex lens layer and a concave lens layer.

17. The image pixel of claim 13, wherein the second microlens layer is formed on the first microlens layer by optical lithography and thermal reflow process.

18. The image pixel of claim 13, further comprising a filter layer formed under the first microlens layer.

19. The image sensor of claim 13, wherein the second microlens layer is formed over the first microlens layer in a shifted position on a lateral axis with respect to the photodiode layer.

* * * * *

UNITED STATES PATENT AND TRADEMARK OFFICE
CERTIFICATE OF CORRECTION

| | | |
|---|---|---|
| PATENT NO. | : 8,921,964 B1 | |
| APPLICATION NO. | : 13/973926 | |
| DATED | : December 30, 2014 | |
| INVENTOR(S) | : Sri Rama Prasanna Pavani | |

It is certified that error appears in the above-identified patent and that said Letters Patent is hereby corrected as shown below:

The Title page, showing the illustrative figure, should be deleted and substitute therefor the attached Title page.

In the Drawings

Delete Drawing Sheets 1-9 and substitute therefore the Drawing Sheets, consisting of Fig. 1A-4B, as shown on the attached pages.

Signed and Sealed this
Twenty-fourth Day of May, 2016

Michelle K. Lee
*Director of the United States Patent and Trademark Office*

(12) United States Patent
Pavani

(10) Patent No.: US 8,921,964 B1
(45) Date of Patent: Dec. 30, 2014

(54) DUAL LAYER PIXEL LENS FOR LOW LIGHT CAMERAS

(71) Applicant: Arecont Vision, LLC., Glendale, CA (US)

(72) Inventor: Sri Rama Prasanna Pavani, Los Angeles, CA (US)

(73) Assignee: Arecont Vision, LLC., Glendale, CA (US)

(*) Notice: Subject to any disclaimer, the term of this patent is extended or adjusted under 35 U.S.C. 154(b) by 0 days.

(21) Appl. No.: 13/973,926

(22) Filed: Aug. 22, 2013

(51) Int. Cl.
*H01L 31/0232* (2014.01)
*H01L 27/146* (2006.01)
*H01L 31/0236* (2006.01)
*H01L 27/144* (2006.01)

(52) U.S. Cl.
CPC .... *H01L 27/14627* (2013.01); *H01L 31/02366* (2013.01); *H01L 27/1446* (2013.01)
USPC .................................. 257/432; 257/436

(58) Field of Classification Search
CPC ........................................... H01L 31/02366
See application file for complete search history.

(56) References Cited

U.S. PATENT DOCUMENTS

| 4,694,185 A | 9/1987 | Weiss |
| 5,323,052 A | 6/1994 | Koyama |
| 5,593,913 A | 1/1997 | Aoki |
| 2005/0242271 A1* | 11/2005 | Wang et al. ............ 250/214.1 |
| 2006/0049439 A1* | 3/2006 | Oh et al. ................ 257/292 |
| 2007/0018213 A1* | 1/2007 | Lim ....................... 257/292 |

* cited by examiner

*Primary Examiner* — Stephen W Smoot
(74) *Attorney, Agent, or Firm* — Christie, Parker & Hale, LLP

(57) ABSTRACT

An image sensor for low light cameras including a plurality of image pixels, each including: a photodiode layer; an oxide layer; a metal layer; a first microlens layer for focusing an incident light onto the photodiode layer; and a second microlens layer formed on top of the first microlens layer for generating a collimated light from a sharp-angled light from a low light camera and illuminating said collimated light to the first microlens layer to be focused on the photodiode layer.

19 Claims, 9 Drawing Sheets